United States Patent
Wieners

(10) Patent No.: US 11,061,119 B2
(45) Date of Patent: Jul. 13, 2021

(54) PIXELS FOR TIME OF FLIGHT (TOF) IMAGING

(71) Applicant: Sensors Unlimited, Inc., Princeton, NJ (US)

(72) Inventor: John Angelo Wieners, Morrisville, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 514 days.

(21) Appl. No.: 16/156,423

(22) Filed: Oct. 10, 2018

(65) Prior Publication Data

US 2020/0116834 A1 Apr. 16, 2020

(51) Int. Cl.
  G01S 7/4863 (2020.01)
  G01S 17/89 (2020.01)
  H01L 27/146 (2006.01)

(52) U.S. Cl.
  CPC .......... *G01S 7/4863* (2013.01); *G01S 17/89* (2013.01); *H01L 27/14609* (2013.01); *H01L 27/14612* (2013.01); *H01L 27/14634* (2013.01); *H01L 27/14636* (2013.01); *H01L 27/14643* (2013.01)

(58) Field of Classification Search
  CPC ...... G01S 7/4863; G01S 17/89; G01S 17/894; G01S 7/4861; G01S 7/4816; H01L 27/14609; H01L 27/14612; H01L 27/14634; H01L 27/14636; H01L 27/14643

See application file for complete search history.

(56) References Cited

U.S. PATENT DOCUMENTS

| | | |
|---|---|---|
| 7,608,823 B2 | 10/2009 | Tennant |
| 7,760,334 B1 | 7/2010 | Evans |
| 8,107,057 B2 | 1/2012 | Audier et al. |
| 8,569,700 B2 | 10/2013 | Bikumandla |
| 9,215,386 B2 | 12/2015 | Elkind et al. |
| 9,523,765 B2 * | 12/2016 | Sun .................. G01S 17/14 |
| 2003/0133029 A1 | 7/2003 | Booth |
| 2006/0007422 A1 | 1/2006 | Dimsdale |
| 2011/0272559 A1 | 11/2011 | Woolaway et al. |
| 2016/0099283 A1 | 4/2016 | Khaliullin |
| 2018/0091746 A1 | 3/2018 | Benser et al. |
| 2019/0302240 A1 * | 10/2019 | Webster .............. G01S 7/4865 |

OTHER PUBLICATIONS

Extended European Search Report dated Mar. 17, 2020, issued during the prosecution of European Patent Application No. EP 19202500.5.

* cited by examiner

*Primary Examiner* — Tony Ko
(74) *Attorney, Agent, or Firm* — Locke Lord LLP; Scott D. Wofsy; Joshua L. Jones

(57) ABSTRACT

A pixel includes a constant current source electrically connected to a first node. An integrating capacitor is electrically connected between the first node and a ground. A sampling transistor is electrically connected between the first node and a second node. A photodiode is electrically connected between a base terminal of the sampling transistor and the ground for switching electrical connectivity through the sampling transistor in response to radiation incident on the photodiode.

17 Claims, 1 Drawing Sheet

PIXELS FOR TIME OF FLIGHT (TOF) IMAGING

BACKGROUND OF THE INVENTION

1. Field of the Invention

The present disclosure relates to imaging devices, and more particularly to time of flight imaging such as for three-dimensional imaging devices.

2. Description of Related Art

Time of flight (TOF) cameras are used to measure distance from the camera to an object, and provide an image where each pixel value represents the distance to that point in its field of view. TOF Cameras operate by transmitting a pulse of light and measuring the amount of time it takes for the light to reflect back to the sensor. Such cameras are used in the field of robotics, video games, and three-dimensional scanners. There is also growing interest in TOF cameras for advancements in unmanned aerial vehicles (UAVs) and self-driving vehicle technologies.

The conventional techniques have been considered satisfactory for their intended purpose. However, there is an ever present need for improved time of flight imaging. This disclosure provides a solution for this need.

SUMMARY OF THE INVENTION

A pixel includes a constant current source electrically connected to a first node. An integrating capacitor is electrically connected between the first node and a ground. A sampling transistor is electrically connected between the first node and a second node. A photodiode is electrically connected between a base terminal of the sampling transistor and the ground for switching electrical connectivity through the sampling transistor in response to radiation incident on the photodiode.

A sampling capacitor can be electrically connected between the second node and the ground for sampling voltage accumulated in the integrating capacitor when the sampling transistor switches to connect the integrating capacitor to the sampling capacitor. An amplifier can be electrically connected to the second node to amplify an electrical signal from the sampling capacitor. A reset transistor can be electrically connected between the first node and the ground to switch electrical connectivity through the reset transistor from the first node to ground based on a reset signal from a controller received at a base terminal of the reset transistor to reset voltage of the integrating capacitor to initiate integrating.

A time of flight (TOF) sensor system includes an array of sensor pixels, each pixel being as described above. The system includes supporting circuitry operatively connected to the array of sensor pixels to convert signals from the sensor pixels into image data.

The system can include an illumination source and a controller operatively connected to the illumination source and the array of sensor pixels to initiate pixel integration and a pulse of illumination so the pixels output a signal indicative to time of flight (TOF) of the pulse of illumination. A reset transistor can be electrically connected between the first node and the ground to switch electrical connectivity through the reset transistor from the first node to ground based on a reset signal from the controller received at a base terminal of the reset transistor to reset voltage of the integrating capacitor to initiate integrating. Optics can be optically connected to the array of sensor pixels for focusing illumination from a scene onto the sensor pixels. A read out only integrated circuit (ROIC) can be operatively connected to the array of sensor pixels. Each amplifier can be connected to output amplified electric signals to the ROIC for data conditioning for output. Each pixel can be configured to generate a pixel value that represents distance between that pixel and a point in a field of view.

A method of time of flight (TOF) imaging includes emitting a pulse of illumination and integrating voltage in an integrating capacitor electrically connected to a constant current source. Integrating voltage is synchronized with emitting the pulse of illumination. The method includes sampling voltage in the integrating capacitor when a return from a scene of the pulse of illumination is detected.

Integrating voltage can be synchronized to begin from zero voltage at the beginning of the pulse of illumination. Sampling voltage can be performed when the return from the scene of the pulse of illumination is detected by a photodiode. Sampling can include transferring voltage from the integrating capacitor to a sampling capacitor.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
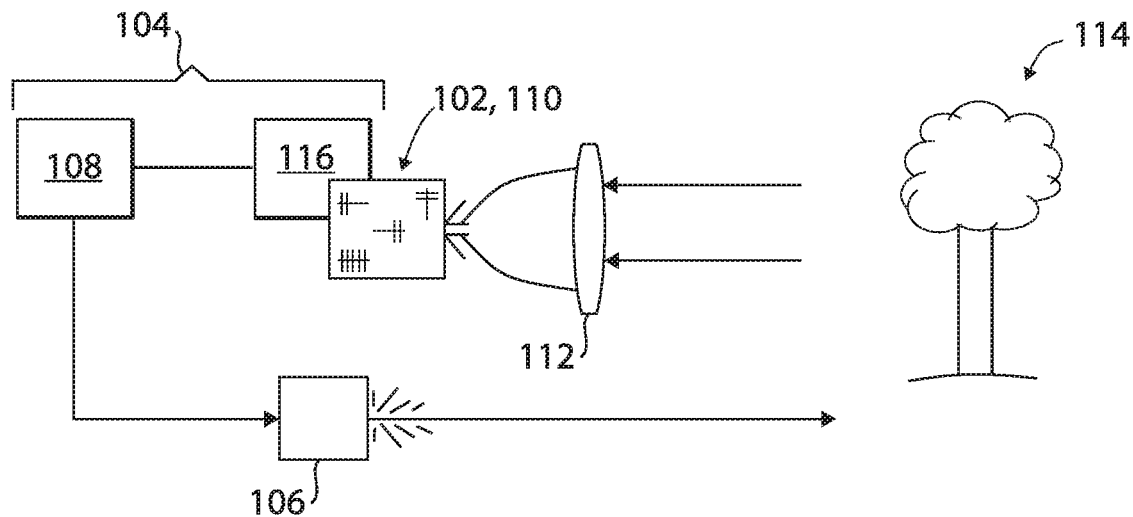
FIG. 1 is a schematic view of an exemplary embodiment of a time of flight (TOF) sensor system constructed in accordance with the present disclosure, showing the array of sensor pixels and supporting circuitry.

Reference will now be made to the drawings wherein like reference numerals identify similar structural features or aspects of the subject disclosure. For purposes of explanation and illustration, and not limitation, a partial view of an exemplary embodiment of a time of flight (TOF) sensor system in accordance with the disclosure is shown in FIG. 1 and is designated generally by reference character 100. Other embodiments of sensor systems in accordance with the disclosure, or aspects thereof, are provided in FIG. 2, as will be described. The systems and methods described herein can be used to form TOF images, where each pixel value represents the distance between the pixel and a point in the field of view.

The time of flight (TOF) sensor system 100, e.g. for a TOF camera, includes an array 102 of sensor pixels 110. The system 100 includes supporting circuitry 104 operatively connected to the array 102 of sensor pixels 110 to convert signals from the sensor pixels 110 into image data.

The system 100 includes an illumination source 106 and a controller 108 operatively connected to the illumination source 106 and to the array 102 of sensor pixels 110 to initiate pixel integration and a pulse of illumination from the illumination source 106 so the pixels 110 can output a signal indicative of time of flight (TOF) of the pulse of illumination. Optics 112 are optically connected to the array 102 of sensor pixels 110 for focusing illumination, e.g., a return of the pulse of illumination from the illumination source 106, from a scene 114 onto the sensor pixels 110. The supporting circuitry 104 includes the controller 108 and a read out only integrated circuit (ROIC) 116 that is operatively connected to the array 102 of sensor pixels 110 for data conditioning for output from the sensor pixels 110.

Figure 2:
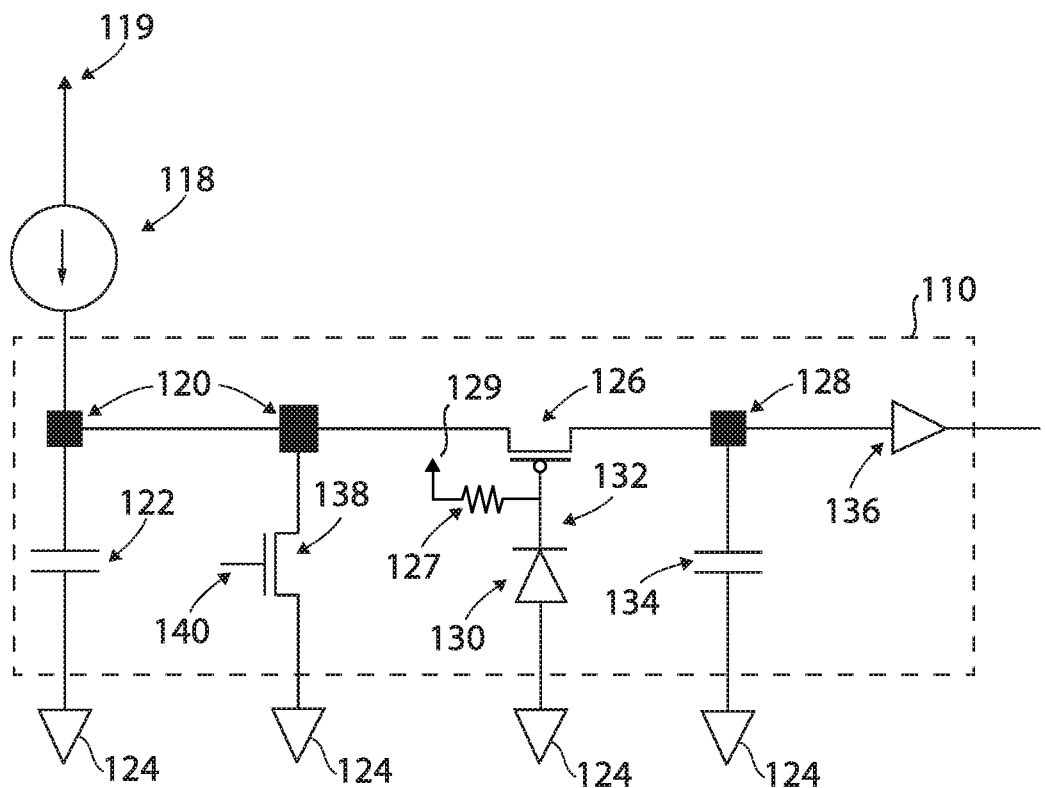
FIG. 2 is a schematic view of a portion of the system of FIG. 1, showing the circuit architecture of one of the sensor pixels.

With reference now to FIG. 2, a constant current source 118 electrically connects a power rail 119 to a first node 120 of each pixel 110. A single current source 118 can be shared by all of the pixels 110 in an array 102, or each column of pixels 110 can have its own current source 118 for example. An integrating capacitor 122 is electrically connected between the first node 120 and a ground 124, e.g. actual ground, a local ground such as a shared negative node, or the like. A sampling transistor 126, e.g., a pmos transistor, is electrically connected between the first node 120 and a second node 128. A photodiode 130, e.g., an avalanche photodiode, is electrically connected between a base terminal 132 of the sampling transistor 126 and the ground 124 for switching electrical connectivity of the first and second nodes 120, 128 through the sampling transistor 126 in response to radiation incident on the photodiode 130. A resistor 127 or other suitable impendence component electrically connects between the base terminal 132 of the transistor 126 and a power rail 129, which can be the same or different from the power rail 119.

A sampling capacitor 134 is electrically connected between the second node 128 and the ground 124 for sampling voltage accumulated in the integrating capacitor 122 when the sampling transistor 126 switches to electrically connect the integrating capacitor 122 to the sampling capacitor 134. An amplifier 136 is electrically connected to the second node 128 to amplify an electrical signal from the sampling capacitor 134 to the ROIC 116 (shown in FIG. 1). The amplifier 136 of each sensing pixel 110 of the array 102 (shown in FIG. 1) can be connected to output amplified electric signals to the ROIC 116 for data conditioning for output from the array 102. Each pixel 110 includes its own amplifier 136. A reset transistor 138, e.g., an nmos transistor, is electrically connected between the first node 120 and the ground 124 to switch electrical connectivity through the reset transistor 138 from the first node 120 to the ground 124 zero out the voltage of the integrating capacitor 122 in response to a reset signal from the controller 108 (shown in FIG. 1) received at a base terminal 140 of the reset transistor 138 to reset voltage of the integrating capacitor 122 to initiate integrating.

A method of time of flight (TOF) imaging includes emitting a pulse of illumination, e.g., from illumination source 106, and integrating voltage in an integrating capacitor, e.g., integrating capacitor 122, electrically connected to a constant current source, e.g., constant current source 118. Integrating voltage is synchronized with emitting the pulse of illumination. The method includes sampling voltage in the integrating capacitor when a return from a scene of the pulse of illumination is detected, so the TOF is proportional to the voltage measured on the integrating capacitor, which can be digitized. The digitized values from an array of pixels, e.g., array 102, can be used to form a digital TOF image of a scene, e.g. scene 114. Integrating voltage is synchronized to begin from zero voltage at the beginning of the pulse of illumination. Sampling voltage is performed when the return from the scene of the pulse of illumination is detected by a photodiode, e.g., photodiode 130. Sampling includes transferring voltage from the integrating capacitor to a sampling capacitor, e.g., sampling capacitor 134.

Systems and methods as disclosed herein provide potential advantages over traditional systems including improved flexibility of sensing distance and reduced pixel complexity. With continuous wave TOF cameras, the sensing distance is limited by the pulse frequency, beyond which aliasing occurs. Conventionally, TOF camera pixels require the inclusion of a comparator, which takes up real estate on the ROIC.

The methods and systems of the present disclosure, as described above and shown in the drawings, provide for time of flight (TOF) imaging with superior properties including flexibility of sensing distance and reduced pixel complexity relative to traditional systems. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A pixel comprising:
   a constant current source electrically connected to a first node;
   an integrating capacitor electrically connected between the first node and a ground;
   a sampling transistor electrically connected between the first node and a second node; and
   a photodiode electrically connected between a base terminal of the sampling transistor and the ground for switching electrical connectivity through the sampling transistor in response to radiation incident on the photodiode.

2. The pixel as recited in claim 1, further comprising a sampling capacitor electrically connected between the second node and the ground for sampling voltage accumulated in the integrating capacitor when the sampling transistor switches to connect the integrating capacitor to the sampling capacitor.

3. The pixel as recited in claim 2, further comprising an amplifier electrically connected to the second node to amplify an electrical signal from the sampling capacitor.

4. The method as recited in claim 3, wherein integrating is performed with a pixel configured to generate a pixel value that represents distance between that pixel and a point in a field of view.

5. The pixel as recited in claim 1, further comprising a reset transistor electrically connected between the first node and the ground to switch electrical connectivity through the reset transistor from the first node to ground based on a reset signal from a controller received at a base terminal of the reset transistor to reset voltage of the integrating capacitor to initiate integrating.

6. A time of flight (TOF) sensor system comprising:
   an array of sensor pixels, each pixel including:
      a constant current source electrically connected to a first node;
      an integrating capacitor electrically connected between the first node and a ground;
      a sampling transistor electrically connected between the first node and a second node; and
      a photodiode electrically connected between a base terminal of the sampling transistor and the ground for switching electrical connectivity through the sampling transistor in response to radiation incident on the photodiode; and supporting circuitry operatively connected to the array of sensor pixels to convert signals from the sensor pixels into image data.

7. The system as recited in claim 6, further comprising an illumination source and a controller operatively connected to the illumination source and the array of sensor pixels to initiate pixel integration and a pulse of illumination so the pixels output a signal indicative to time of flight (TOF) of the pulse of illumination.

8. The system as recited in claim 7, further comprising a reset transistor electrically connected between the first node and the ground to switch electrical connectivity through the reset transistor from the first node to ground based on a reset signal from the controller received at a base terminal of the reset transistor to reset voltage of the integrating capacitor to initiate integrating.

9. The system as recited in claim 6, further comprising optics optically connected to the array of sensor pixels for focusing illumination from a scene onto the sensor pixels.

10. The system as recited in claim 6, further comprising a sampling capacitor electrically connected between the second node and the ground for sampling voltage accumulated in the integrating capacitor when the sampling transistor switches to connect the integrating capacitor to the sampling capacitor.

11. The system as recited in claim 10, further comprising an amplifier electrically connected to the second node to amplify an electrical signal from the sampling capacitor.

12. The system as recited in claim 10, further comprising a read out only integrated circuit (ROIC) operatively connected to the array of sensor pixels, wherein each amplifier is connected to output amplified electric signals to the ROIC for data conditioning for output.

13. The system as recited in claim 6, wherein each pixel is configured to generate a pixel value represents distance between that pixel and a point in a field of view.

14. A method of time of flight (TOF) imaging comprising:
emitting a pulse of illumination;
integrating voltage in an integrating capacitor electrically connected to a constant current source, wherein the integrating voltage is synchronized with the emitting of the pulse of illumination; and
sampling voltage in the integrating capacitor when a return from a scene of the pulse of illumination is detected.

15. The method as recited in claim 14, wherein integrating voltage is synchronized to begin from zero voltage at the beginning of the pulse of illumination.

16. The method as recited in claim 14, wherein sampling voltage is performed when the return from the scene of the pulse of illumination is detected by a photodiode.

17. The method as recited in claim 14, wherein sampling includes transferring voltage from the integrating capacitor to a sampling capacitor.

\* \* \* \* \*